United States Patent
Ichikawa

(10) Patent No.: US 11,872,932 B2
(45) Date of Patent: Jan. 16, 2024

(54) LIGHTING CIRCUIT FOR AUTOMOTIVE LAMP

(71) Applicant: KOITO MANUFACTURING CO., LTD., Tokyo (JP)

(72) Inventor: Tomoyuki Ichikawa, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 271 days.

(21) Appl. No.: 17/496,822

(22) Filed: Oct. 8, 2021

(65) Prior Publication Data

US 2022/0030684 A1 Jan. 27, 2022

Related U.S. Application Data

(63) Continuation of application No. PCT/JP2020/015846, filed on Apr. 8, 2020.

(30) Foreign Application Priority Data

Apr. 11, 2019 (JP) .................................. 2019-075859

(51) Int. Cl.
*H05B 45/50* (2022.01)
*B60Q 11/00* (2006.01)
(Continued)

(52) U.S. Cl.
CPC .............. *B60Q 11/00* (2013.01); *B60Q 1/507* (2022.05); *B60Q 1/543* (2022.05); *H05B 45/20* (2020.01); *H05B 45/50* (2020.01)

(58) Field of Classification Search
CPC ........ H05B 45/20; H05B 45/50; H05B 45/32; H05B 45/37; H05B 45/46; H05B 45/48;
(Continued)

(56) References Cited

U.S. PATENT DOCUMENTS

2017/0182941 A1  6/2017  Ohta
2017/0235305 A1* 8/2017  Jung ...................... G05D 1/021
                                                                    701/23
(Continued)

FOREIGN PATENT DOCUMENTS

CN     106274653 A    1/2017
JP     2012-084263 A  4/2012
(Continued)

OTHER PUBLICATIONS

International Preliminary Report on Patentability (Form PCT/IB/373) and the Written Opinion of the International Searching Authority (Form PCT/ISA/237) dated Sep. 28, 2021, in the corresponding International Application No. PCT/JP2020/015846. (8 pages).
(Continued)

*Primary Examiner* — Haissa Philogene
(74) *Attorney, Agent, or Firm* — BUCHANAN INGERSOLL & ROONEY PC

(57) ABSTRACT

An automotive lamp includes a first semiconductor light source and a second semiconductor light source configured to emit different colors, and to mix the two colors, so as to generate mixed-color light. A first driving circuit supplies a first driving current stabilized to a first target amount to the first semiconductor light source. A second driving circuit supplies a second driving current stabilized to a second target amount to the second semiconductor light source. Upon detecting an abnormal non-lighting state in the first semiconductor light source, the first abnormal state detection circuit stops the operation of the second driving circuit. Upon detecting an abnormal non-lighting state in the second semiconductor light source, the second abnormal state detection circuit stops the operation of the first driving circuit.

7 Claims, 3 Drawing Sheets

(51) Int. Cl.
*H05B 45/20* (2020.01)
*B60Q 1/50* (2006.01)

(58) Field of Classification Search
CPC ...... H05B 45/52; H05B 45/54; H05B 45/345; B60Q 1/507; B60Q 1/543; B60Q 1/381; B60Q 11/007
See application file for complete search history.

(56) References Cited

U.S. PATENT DOCUMENTS

| | | | |
|---|---|---|---|
| 2018/0063907 A1* | 3/2018 | Kambara | H02M 3/33507 |
| 2018/0070416 A1* | 3/2018 | Kato | B60Q 11/00 |
| 2020/0307573 A1* | 10/2020 | Kato | B60W 60/0027 |
| 2022/0349544 A1* | 11/2022 | Yamamoto | B60Q 1/381 |

FOREIGN PATENT DOCUMENTS

| | | |
|---|---|---|
| JP | 2014-017058 A | 1/2014 |
| JP | 2017-119449 A | 7/2017 |

OTHER PUBLICATIONS

International Search Report (Form PCT/ISA/210) dated Jun. 2, 2020, in the corresponding International Application No. PCT/JP2020/015846. (4 pages).

* cited by examiner

LIGHTING CIRCUIT FOR AUTOMOTIVE LAMP

BACKGROUND

1. Technical Field

The present disclosure relates to an automotive lamp employed in an automobile or the like.

2. Description of the Related Art

In recent years, the development of autonomous driving of automobiles has been advancing. In order to notify traffic participants in the vicinity of an automobile traveling in an autonomous driving mode, the lighting of a turquoise-blue lamp is under discussion in international standards.

In the CIE xy chromaticity diagram, turquoise blue is positioned in a range enclosed by the four points (0.0292, 0.3775), (0.2050, 0.3775), (0.1965, 0.3380), and (0.0370, 0.3380).

The present inventor prepared an arrangement with multiple light sources that support different colors, and investigated the generation of turquoise blue by color mixing of multiple colors of light. However, with such an arrangement, if an abnormal state occurs in any one of the light sources, light having a color that differs from turquoise blue is emitted. This leads to a problem of providing erroneous information to traffic participants in the vicinity.

The same problem occurs in a light source configured to generate a color that differs from turquoise blue by color mixing of multiple colors.

SUMMARY

The present disclosure has been made in view of such a situation.

A summary of several example embodiments of the disclosure follows. This outline is provided for the convenience of the reader to provide a basic understanding of such embodiments and does not wholly define the breadth of the disclosure. This outline is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

One embodiment of the present disclosure relates to a lighting circuit for an automotive lamp including a first semiconductor light source and a second semiconductor light source having different colors, and structured to mix the two colors so as to generate mixed-color light. The lighting circuit includes: a first driving circuit structured to supply a first driving current stabilized to a first target amount to the first semiconductor light source; a second driving circuit structured to supply a second driving current stabilized to a second target amount to the second semiconductor light source; a first abnormal state detection circuit structured to stop the operation of the second driving circuit upon detecting an abnormal non-lighting state in the first semiconductor light source; and a second abnormal state detection circuit structured to stop the operation of the first driving circuit upon detecting an abnormal non-lighting state in the second semiconductor light source.

With this embodiment, the lighting circuit is capable of supporting a protection operation as an internal function in which, when either one of the semiconductor light sources is not able to emit light, the other semiconductor light source is forcibly turned off. This prevents the automotive lamp from emitting light in a color that differs from a desired color. Accordingly, this prevents the automotive lamp from presenting erroneous information to traffic participants in the vicinity, thereby providing improved safety.

In one embodiment, when at least one from among the first abnormal state detection circuit and the second abnormal state detection circuit detects the abnormal non-lighting state, the lighting circuit may notify an in-vehicle controller of the detection of the abnormal non-lighting state. This allows an in-vehicle controller to notify the user of the occurrence of an abnormal non-lighting state in the automotive lamp. In a case in which the automotive lamp is configured as a turquoise-blue lamp for indicating that the vehicle is in an autonomous driving mode, this allows various kinds of countermeasures to be executed, examples of which include prompting the user to switch the driving mode to the manual driving mode, forcibly switching to the manual driving mode, bringing the vehicle to an emergency stop, and the like, in addition to notifying the user of information that the vehicle is not able to continue the autonomous driving.

In one embodiment, the first driving circuit and the second driving circuit may have the same circuit configuration. In one embodiment, the first abnormal state detection circuit and the second abnormal state detection circuit may have the same circuit configuration.

In one embodiment, the first abnormal state detection circuit and the second abnormal state detection circuit may each be structured such that, when a voltage across a corresponding semiconductor light-emitting element becomes smaller than a threshold value, or a current that flows through the corresponding semiconductor light-emitting element becomes smaller than a threshold value, judgment is made that an abnormal non-lighting state has occurred. This allows an abnormal non-lighting state due to a short-circuit fault or an open-circuit fault to be detected.

In one embodiment, the first semiconductor light source may be structured to emit blue light. In one embodiment, the second semiconductor light source may be structured to emit green light. In this case, turquoise-blue light can be generated.

One embodiment of the present disclosure relates to an automotive lamp. The automotive lamp may include: a first semiconductor light source and a second semiconductor light source structured to emit different colors (wavelengths of emitted light); and any one of the lighting circuits described above.

In one embodiment, the automotive lamp may be structured as an LED socket.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
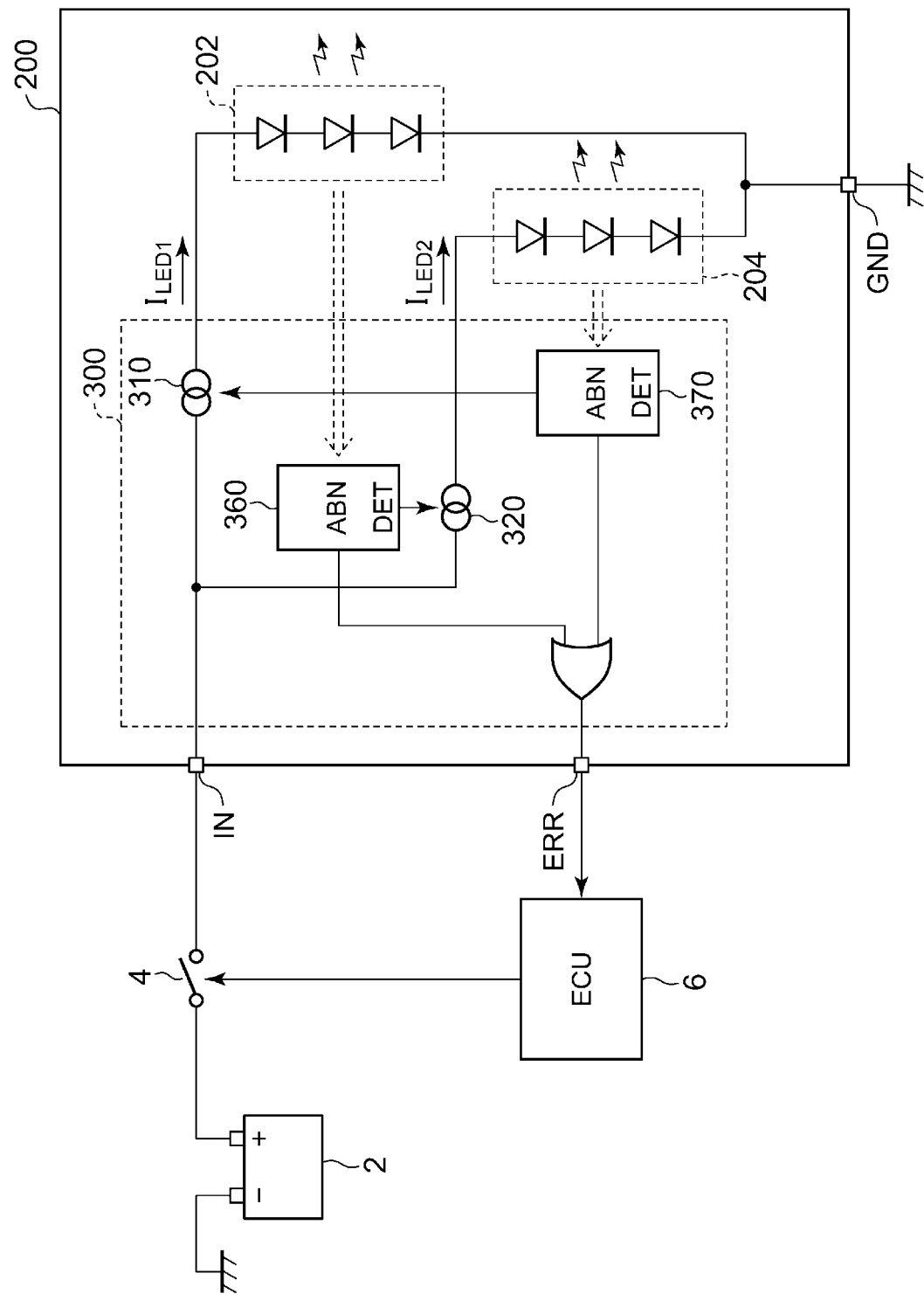
FIG. 1 is a circuit diagram showing an automotive lamp according to an embodiment.

Description will be made below regarding the present disclosure based on preferred embodiments with reference to the drawings. The same or similar components, members, and processes are denoted by the same reference numerals, and redundant description thereof will be omitted as appropriate. The embodiments have been described for exemplary purposes only, and are by no means intended to restrict the present disclosure. Also, it is not necessarily essential for the present disclosure that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

In the present specification, the reference symbols denoting electric signals such as a voltage signal, current signal, or the like, and the reference symbols denoting circuit elements such as a resistor, capacitor, or the like, also represent the corresponding voltage value, current value, resistance value, or capacitance value as necessary.

FIG. 1 is a circuit diagram showing an automotive lamp 200 according to an embodiment. The automotive lamp 200 is mounted on an autonomous driving vehicle. The automotive lamp 200 emits light in a turquoise-blue color, which indicates that the automobile is in an autonomous driving mode. When the vehicle is set to the autonomous driving mode, a switch 4 is turned on, which supplies a DC voltage (input voltage) $V_{IN}$ to the automotive lamp 200 from a battery 2. In responsive to receiving the supply of the input voltage $V_{IN}$, the automotive lamp 200 turns on. The switch 4 is controlled by an in-vehicle Electronic Control Unit (ECU) 6.

The automotive lamp 200 includes a first semiconductor light source 202, a second semiconductor light source 204, and a lighting circuit 300. The first semiconductor light source 202 includes a single blue semiconductor light-emitting element, or multiple blue semiconductor light-emitting elements coupled in series. The second semiconductor light source 204 includes a single green semiconductor light-emitting element, or multiple green semiconductor light-emitting elements coupled in series. The semiconductor light-emitting elements are each preferably configured as a light-emitting diode (LED). Also, the semiconductor light-emitting elements may each be configured as a laser diode (LD) or an organic Electro-Luminescence (EL) element.

A preferred embodiment of the automotive lamp 200 is configured as a semiconductor light source that can be replaced by a normal product when a malfunction such as disconnection or the like occurs, as with conventional general-purpose electric bulbs. Such a semiconductor light source is referred to as an LED socket. Specifically, the automotive lamp 200 is configured as an LED socket including the first semiconductor light source 202, the second semiconductor light source 204, the lighting circuit 300, an unshown circuit board, and an unshown heatsink, housed in the form of a single package. The automotive lamp 200 has a structure that allows it to be detachably mounted on an unshown lamp body. It is needless to say that such an LED socket is required to have a long operating life. In addition, the LED socket, which is used as a consumable, is strongly required to have a low cost.

The lighting circuit 300 includes a first driving circuit 310, a second driving circuit 320, a first abnormal state detection circuit 360, and a second abnormal state detection circuit 370. The first driving circuit 310 supplies a first driving current $I_{LED1}$ stabilized to a first target amount to the first semiconductor light source 202. The second driving circuit 320 supplies a second driving current $I_{LED2}$ stabilized to a second target amount to the second semiconductor light source 204.

In responsive to detecting an abnormal state in which the first semiconductor light source 202 is not able to turn on, the first abnormal state detection circuit 360 stops the operation of the second driving circuit 320. In responsive to detecting an abnormal state in which the second semiconductor light source 204 is not able to turn on, the second abnormal state detection circuit 370 stops the operation of the first driving circuit 310. Here, the "abnormal state in which the light source is not able to turn on" may include a state in which the light source emits light with low luminance as compared with a normal state, in addition to a state in which the light source, i.e., the first semiconductor light source 202 or the second semiconductor light source 204, is completely off.

Preferably, the automotive lamp 200 is configured such that, when at least one from among the first abnormal state detection circuit 360 and the second abnormal state detection circuit 370 detects an abnormal non-lighting state, the in-vehicle ECU 6 is notified of this information. Specifically, the automotive lamp 200 is provided with an error notification pin ERR. When an abnormal non-lighting state has occurred, an error signal ERR having a predetermined level (e.g., high level) is output from the pin ERR (asserted). It should be noted that the assertion of the error signal ERR indicates that both the first semiconductor light source 202 and the second semiconductor light source 204 are turned off.

The above is the configuration of the automotive lamp 200. With the automotive lamp 200, the lighting circuit 300 (automotive lamp 200) supports a protection operation as its internal function in which, when either the first semiconductor light source 202 or the second semiconductor light source 204 is not able to turn on, the other semiconductor light source is forcibly turned off. This ensures that the automotive lamp 200 does not emit light in a color (e.g., green or blue) that differs from a desired color (turquoise blue, in this example). This prevents the automotive lamp 200 from presenting erroneous information to traffic participants in the vicinity, thereby providing improved safety.

Furthermore, when at least one from among the first abnormal state detection circuit 360 and the second abnormal state detection circuit 370 detects an abnormal non-lighting state, the lighting circuit 300 is configured to notify the in-vehicle ECU 6 of this information. With this, the ECU 6 is capable of notifying the user (driver) of the occurrence of the abnormal non-lighting state in the automotive lamp 200, thereby prompting the user to perform repair or replacement. Also, when such an abnormal non-lighting state occurs in an automotive lamp configured as a turquoise-blue lamp for indicating that the vehicle is in an autonomous driving mode, such an arrangement is capable of notifying the user of information that the vehicle is not able to continue the autonomous driving. Furthermore, this allows various kinds of countermeasures to be executed, examples of which include prompting the user to switch the driving mode to the manual driving mode, forcibly switching to the manual driving mode, bringing the vehicle to an emergency stop, and the like.

The present disclosure encompasses various kinds of apparatuses and methods that can be regarded as a block configuration or cross-sectional configuration shown in FIG. 1, or otherwise that can be derived from the aforementioned description. That is to say, the present disclosure is not restricted to a specific configuration. More specific description will be made below regarding example configurations or examples for clarification and ease of understanding of the essence of the present disclosure and the operation thereof. That is to say, the following description will by no means be intended to restrict the technical scope of the present disclosure.

Figure 2:
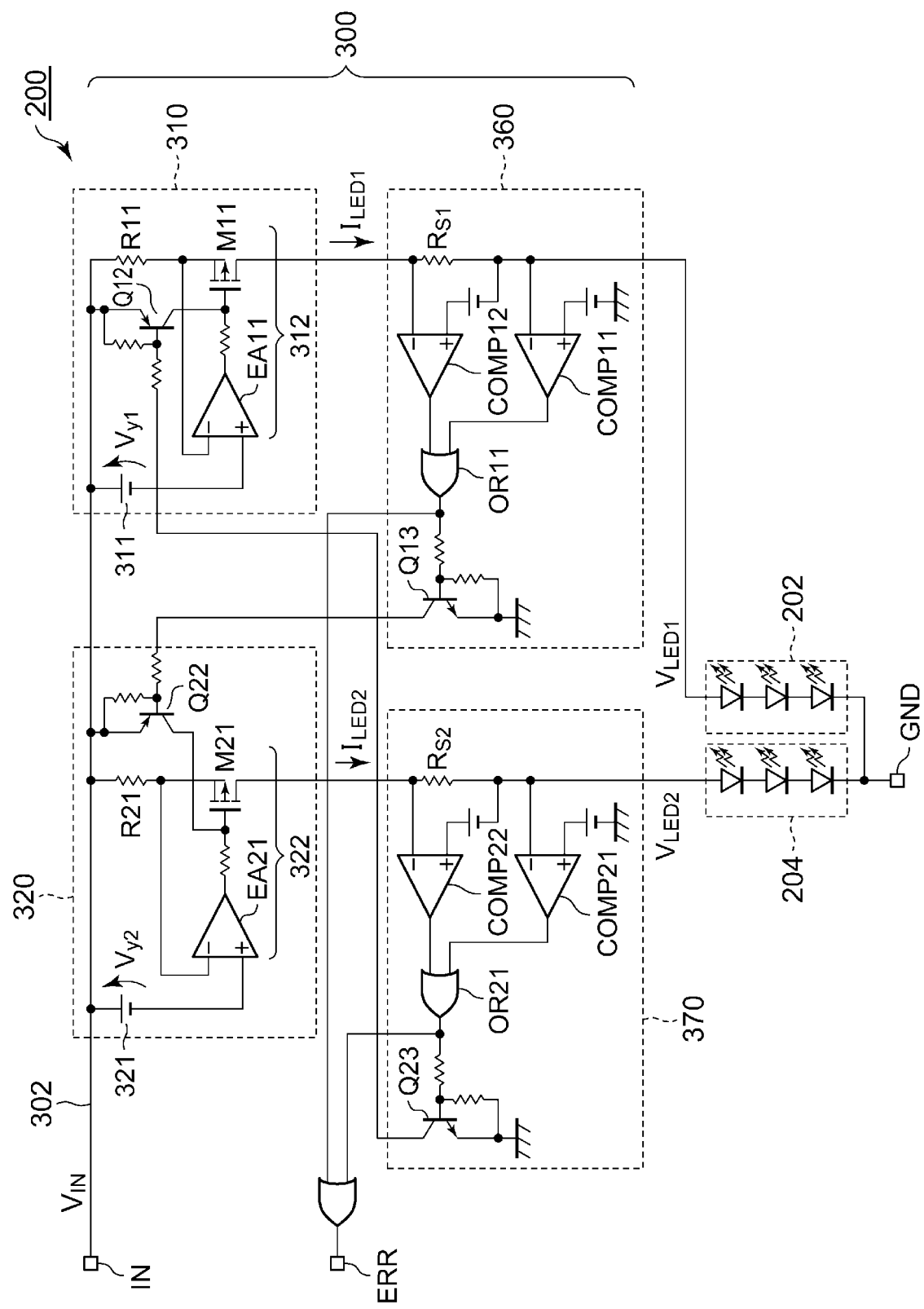
FIG. 2 is a circuit diagram showing an automotive lamp according to an example.

FIG. 2 is a circuit diagram showing an automotive lamp 200 according to an embodiment. The first driving circuit 310 includes a voltage source 311 and a current source 312. The voltage source 311 generates a voltage Vy1 with an input line 302 as a reference. The current source 312 is coupled to the anode of the first semiconductor light source 202. The current source 312 is configured as a current-source driver that supplies the first driving current $I_{LED1}$ which is proportional to the dimming voltage Vy1, and is configured as a V/I converter circuit.

The current source 312 includes a resistor R11, a transistor M11, and an error amplifier EA11. The target amount $I_{REF1}$ of the first driving current $I_{LED1}$ to be generated by the current source 312 is represented by Expression (1).

$$I_{REF1} = Vy/R11 \quad (1)$$

The first driving circuit 310 includes a transistor Q12. The transistor Q12 is arranged between the gate of the transistor M11 and the input line 302. When the transistor Q12 is set to the conduction state, the transistor M11 is set to the disconnection state, thereby stopping the driving current $I_{LED1}$.

The second driving circuit 320 has the same configuration as that of the first driving circuit 310. Specifically, the second driving circuit 320 includes a voltage source 321, a current source 322, and a transistor Q22. The current source 322 has the same circuit configuration as that of the current source 312. The voltage source 321 has the same circuit configuration as that of the voltage source 311. The transistor Q22 corresponds to the transistor Q12.

The first abnormal state detection circuit 360 is configured to be capable of detecting the occurrence of an abnormal non-lighting state in the first semiconductor light source 202. For example, the first abnormal state detection circuit 360 detects an abnormal non-lighting state due to the occurrence of a short-circuit fault (ground fault of the anode) in the first semiconductor light source 202. When such a short-circuit fault occurs, the voltage across the anode and the cathode of the first semiconductor light source 202 falls to the vicinity of zero. Accordingly, the first abnormal state detection circuit 360 includes a short-circuit detection comparator COMP11 that compares the voltage (i.e., anode voltage) $V_{LED1}$ across the first semiconductor light source 202 with a threshold voltage $V_{TH1}$. When $V_{LED1} < V_{TH1}$, i.e., when a light does not turn on due to the occurrence of a short-circuit fault, the output of the short-circuit detection comparator COMP11 is set to the high level.

Furthermore, the first abnormal state detection circuit 360 is capable of detecting an abnormal non-lighting state due to the occurrence of an open-circuit fault in the first semiconductor light source 202. When such an open-circuit fault occurs, no current flows through the first semiconductor light source 202. Accordingly, when the first driving current $I_{LED1}$ becomes smaller than a threshold current, the first abnormal state detection circuit 360 judges that an open-circuit fault has occurred. Specifically, a sensing resistor Rs1 is inserted on a path of the first driving current $I_{LED1}$. The open-circuit detection comparator COMP12 compares the voltage drop Vs1 across the sensing resistor Rs1 with a threshold voltage $V_{TH2}$. When Vs1<$V_{TH2}$, the output of the open-circuit detection comparator COMP12 becomes the high level.

The outputs of the two comparators COMP11 and COMP12 are combined by an OR gate OR11. A transistor Q13 is coupled to the base of the transistor Q22. When an abnormal state is detected by the first abnormal state detection circuit 360, a collector current flows through the transistor Q13, which sets the transistor Q22 of the second driving circuit 320 to a conduction state. This stops the operation of the second driving circuit 320. In this state, the second driving current $I_{LED2}$ becomes zero, thereby forcibly turning off the second semiconductor light source 204.

The second abnormal state detection circuit 370 has the same configuration as that of the first abnormal state detection circuit 360. Specifically, the second abnormal state detection circuit 370 includes a short-circuit detection comparator COMP21, an open-circuit detection comparator COMP22, a sensing resistor Rs2, an OR gate OR21, and a transistor Q23.

When at least one from among the short-circuit detection comparator COMP21 and the open-circuit detection comparator COMP 22 detects an abnormal non-lighting state, the transistor Q23 is set to the conduction state. This turns on the transistor Q21 included in the first driving circuit 310, which stops the operation of the first driving circuit 310. In this state, the first driving current $I_{LED1}$ becomes zero, thereby forcibly turning off the first semiconductor light source 202.

Furthermore, the automotive lamp 200 outputs an error signal ERR from an ERR pin. An OR gate OR3 generates the logical OR of the output of the OR gate OR11 included in the first abnormal state detection circuit 360 and the output of the OR gate OR21 included in the second abnormal state detection circuit 370, and outputs the logical OR as the error signal ERR.

Figure 3A:
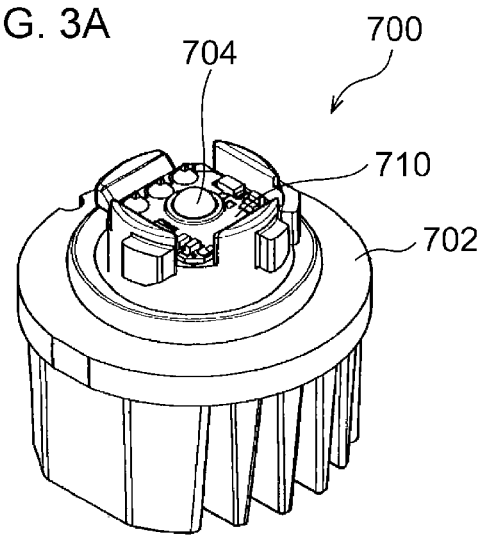
FIGS. 3A through 3D are diagrams each showing an LED socket configured as an example of the automotive lamp.
Figure 3B:
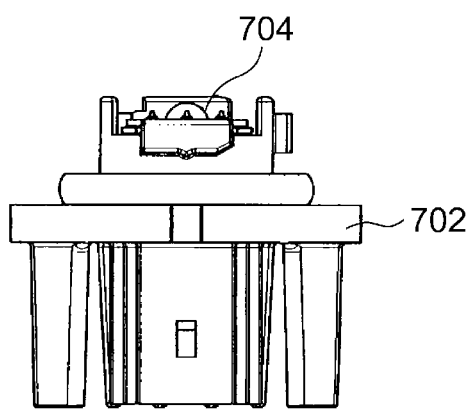
Figure 3C:
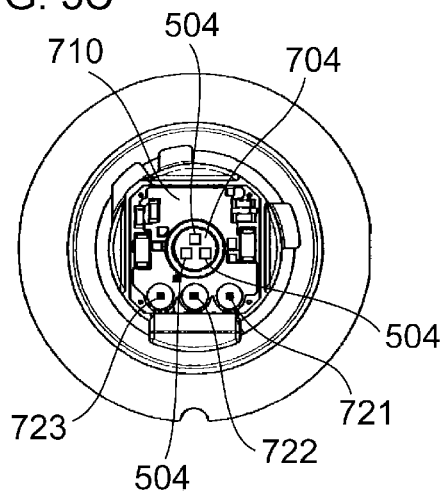
Figure 3D:
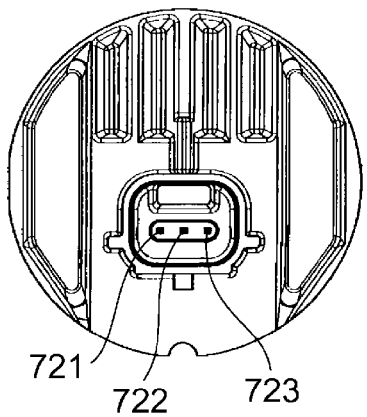

FIGS. 3A through 3D are diagrams showing an LED socket configured as an example of the automotive lamp 200. FIG. 3A is an external perspective view of an LED socket 700. FIG. 3B is a front view of the LED socket 700. FIG. 3C is a plan view of the LED socket 700. FIG. 3D is a bottom view of the LED socket 700.

A housing 702 has a structure that allows it to be detachably mounted on an unshown lamp body. Multiple light-emitting elements 504 are mounted in a central portion of the housing 702. The multiple light-emitting elements 504 are covered by a transparent cover 704. Components of the lighting circuit 300 are mounted on a circuit board 710. The multiple light-emitting elements 504 include a blue LED chip that forms the first semiconductor light source 202 and a green LED chip that forms the second semiconductor light source 204.

Three pins 721, 722, and 723 are provided on the bottom side of the housing 702 such that they are exposed. The input voltage $V_{IN}$ is supplied to the pin 721 via a switch. The ground voltage is supplied to the pin 722. The pin 723 is configured as an error pin that allows the in-vehicle ECU to be notified of the occurrence of an abnormal state. The pins 721 through 723 are arranged such that they pass through the internal space of the housing 702 and such that one end of each pin is coupled to a wiring pattern formed on the circuit board 710.

Description has been made above regarding the present disclosure with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present disclosure. Description will be made below regarding such modifications.

Modification 1

Description has been made regarding a current source configuration. Also, the circuit layout may be inverted so as to provide a current sink circuit.

Modification 2

Description has been made in the embodiment regarding a turquoise-blue light source configured to mix blue light and green light. However, the combination of colors is not restricted to such an example.

Modification 3

An arrangement configured to stop the first driving circuit 310 and the second driving circuit 320 when an abnormal state has occurred is not restricted in particular. FIG. 2 shows an example in which the transistors M11 and M21 are forcibly turned off when the first driving circuit 310 and the second driving circuit 320 are to be stopped. Instead, an arrangement may be made in which the dimming voltages Vy1 and Vy2 are set to zero when the first driving circuit 310 and the second driving circuit 320 are to be stopped. Alternatively, a switch may be inserted in series with each of the transistors M11 and M21 so as to provide such a forced turn-off function. Also, a bypass switch may be provided in parallel with each of the first semiconductor light source 202 and the second semiconductor light source 204. With such an arrangement, the bypass switches may be turned on so as to provide such a forced turn-off function.

Modification 4

Description has been made with reference to FIG. 2 regarding an arrangement in which the sensing resistors Rs1 and Rs2 are provided in order to support open-circuit fault detection. Also, such sensing resistors Rs1 and Rs2 may be omitted. In this case, a voltage drop may be monitored for each of the resistors R11 and R21.

Description has been made regarding the present disclosure with reference to the embodiments using specific terms. However, the above-described embodiments show only the mechanisms and applications of the present disclosure. Rather, various modifications and various changes in the layout can be made without departing from the spirit and scope of the present invention defined in appended claims.

What is claimed is:

1. A lighting circuit for an automotive lamp, wherein the automotive lamp comprises a first semiconductor light source and a second semiconductor light source having different colors and is structured to mix the two colors so as to generate mixed-color light, the lighting circuit comprising:
    a first driving circuit structured to supply a first driving current stabilized to a first target amount to the first semiconductor light source;
    a second driving circuit structured to supply a second driving current stabilized to a second target amount to the second semiconductor light source;
    a first abnormal state detection circuit structured to stop an operation of the second driving circuit in responsive to detecting an abnormal non-lighting state in the first semiconductor light source; and
    a second abnormal state detection circuit structured to stop an operation of the first driving circuit in responsive to detecting an abnormal non-lighting state in the second semiconductor light source.

2. The lighting circuit according to claim 1, wherein, when at least one of the first abnormal state detection circuit and the second abnormal state detection circuit detects the abnormal non-lighting state, the lighting circuit notifies an in-vehicle controller of the detection of the abnormal non-lighting state.

3. The lighting circuit according to claim 1, wherein the first driving circuit and the second driving circuit have the same circuit configuration,
    and wherein the first abnormal state detection circuit and the second abnormal state detection circuit have the same circuit configuration.

4. The lighting circuit according to claim 3, wherein the first abnormal state detection circuit and the second abnormal state detection circuit are each structured such that, when a voltage across a corresponding semiconductor light-emitting element becomes smaller than a threshold value, or a current that flows through the corresponding semiconductor light-emitting element becomes smaller than a threshold value, judgment is made that an abnormal non-lighting state has occurred.

5. The lighting circuit according to claim 1, wherein the first semiconductor light source emits blue light,
    and wherein the second semiconductor light source emits green light.

6. An automotive lamp comprising:
    a first semiconductor light source and a second semiconductor light source having different colors; and
    the lighting circuit according to claim 1.

7. The automotive lamp according to claim 6, structured as an LED socket.

* * * * *